(12) United States Patent
Nagelmüller et al.

(10) Patent No.: US 11,337,328 B2
(45) Date of Patent: May 17, 2022

(54) POWER ASSEMBLY HAVING A LOAD-BEARING COOLING BODY

(71) Applicant: Miba Energy Holding GmbH, Laakirchen (AT)

(72) Inventors: Martin Nagelmüller, Edt bei Lambach (AT); Ratzi Raimund, Wels (AT)

(73) Assignee: Miba Energy Holding GmbH, Laakirchen (AT)

( * ) Notice: Subject to any disclaimer, the term of this patent is extended or adjusted under 35 U.S.C. 154(b) by 0 days.

(21) Appl. No.: 17/058,107

(22) PCT Filed: May 23, 2019

(86) PCT No.: PCT/AT2019/060172
§ 371 (c)(1),
(2) Date: Nov. 23, 2020

(87) PCT Pub. No.: WO2019/222781
PCT Pub. Date: Nov. 28, 2019

(65) Prior Publication Data
US 2021/0212233 A1  Jul. 8, 2021

(30) Foreign Application Priority Data
May 25, 2018  (AT) .............................. A 50430/2018

(51) Int. Cl.
*H05K 7/20* (2006.01)
*H02B 1/56* (2006.01)
(Continued)

(52) U.S. Cl.
CPC .......... *H05K 7/1427* (2013.01); *H02B 1/565* (2013.01); *H05K 7/209* (2013.01); *H05K 7/20927* (2013.01); *H05K 7/18* (2013.01)

(58) Field of Classification Search
None
See application file for complete search history.

(56) References Cited

U.S. PATENT DOCUMENTS

2003/0133259 A1* 7/2003 Meyer ..................... B60L 50/50
361/677
2004/0060689 A1  4/2004 Pfeifer et al.
(Continued)

FOREIGN PATENT DOCUMENTS

CN  106452105 A   2/2017
DE  29813254 U1  10/1998
(Continued)

*Primary Examiner* — Courtney L Smith
(74) *Attorney, Agent, or Firm* — Stoel Rives LLP

(57) ABSTRACT

The invention relates to a power module (4) for a medium or high voltage converter (1), preferably a modular multi-level converter, comprising at least one power semiconductor module (7), preferably an IGBT assembly, at least one energy storage module (9), preferably a capacitor module, at least one cooling device (14), wherein the cooling device (14) is formed as a cooling plate (17) that can be run through by a coolant, in particular flown through by a cooling liquid, and the at least one power semiconductor module (7) and/or the at least one energy storage module (9) are arranged on an upper side (18) and/or bottom side (19) of the cooling plate (17), and wherein the at least the power semiconductor module (7) is connected with the cooling plate (17) in a thermally conductive manner, and wherein the cooling plate (17) is provided for load-bearing support on a rack (2) of an assigned receiving space (3) of the medium or high voltage converter (1) and comprises support surfaces (16) projecting laterally in the transverse direction (11) with respect to at least one energy storage width (21) of the energy storage module (9).

18 Claims, 6 Drawing Sheets

(51) Int. Cl.
*H05K 7/14* (2006.01)
*H05K 7/18* (2006.01)

(56) References Cited

U.S. PATENT DOCUMENTS

| | | | |
|---|---|---|---|
| 2005/0002162 | A1 | 1/2005 | Beihoff et al. |
| 2005/0247433 | A1 | 11/2005 | Corrado et al. |
| 2008/0092387 | A1 | 4/2008 | Campbell et al. |
| 2008/0130223 | A1 | 6/2008 | Nakamura et al. |
| 2009/0091897 | A1 | 4/2009 | Willing et al. |
| 2010/0321896 | A1 | 12/2010 | Yamada |
| 2013/0063897 | A1* | 3/2013 | Howes ............... H05K 7/20936 361/700 |
| 2014/0036418 | A1* | 2/2014 | Eichler ............... H05K 7/1432 361/605 |
| 2016/0128240 | A1 | 5/2016 | Park |
| 2017/0150639 | A1* | 5/2017 | Garriga ................ H01L 23/367 |
| 2017/0194878 | A1 | 7/2017 | Jones et al. |
| 2018/0013355 | A1* | 1/2018 | Tokuyama ............. H01L 23/48 |
| 2018/0316163 | A1* | 11/2018 | Jung ....................... H02B 1/20 |
| 2019/0289753 | A1* | 9/2019 | Nakamura ......... H05K 7/20254 |

FOREIGN PATENT DOCUMENTS

| | | |
|---|---|---|
| EP | 1125355 B1 | 11/2002 |
| EP | 1448040 A2 | 8/2004 |
| EP | 2254228 A1 | 11/2010 |
| EP | 2701477 A1 | 2/2014 |
| JP | 2012105419 A | 5/2012 |
| JP | 2014011926 A | 1/2014 |
| WO | 2008074274 A1 | 6/2008 |

\* cited by examiner

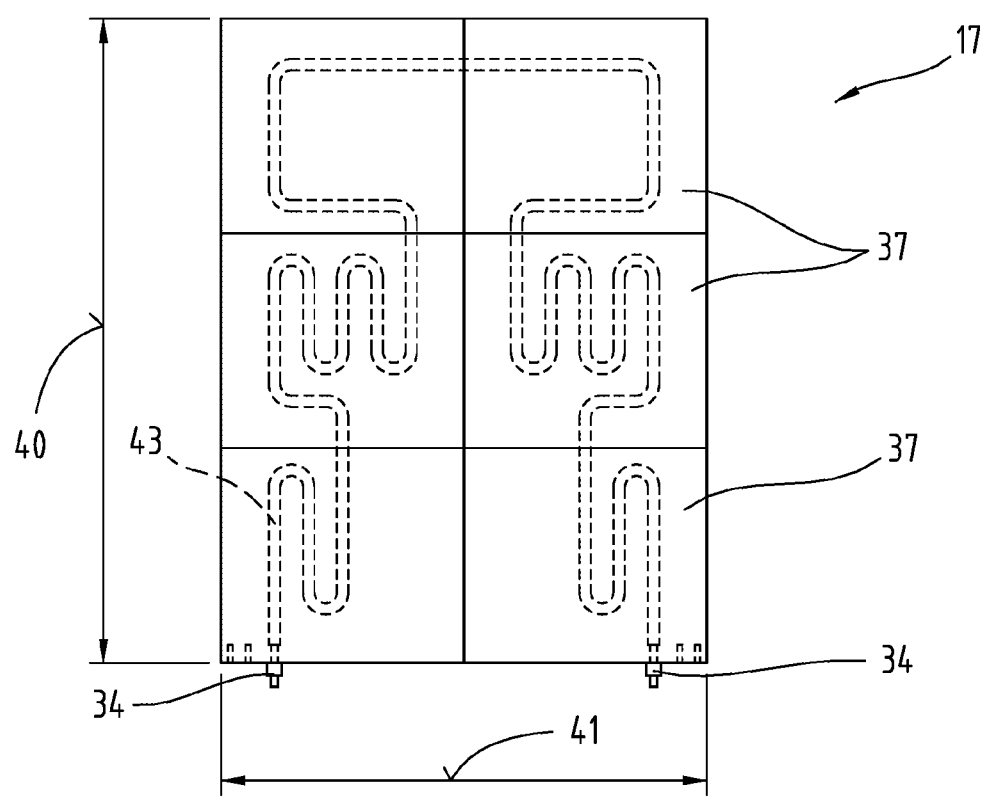

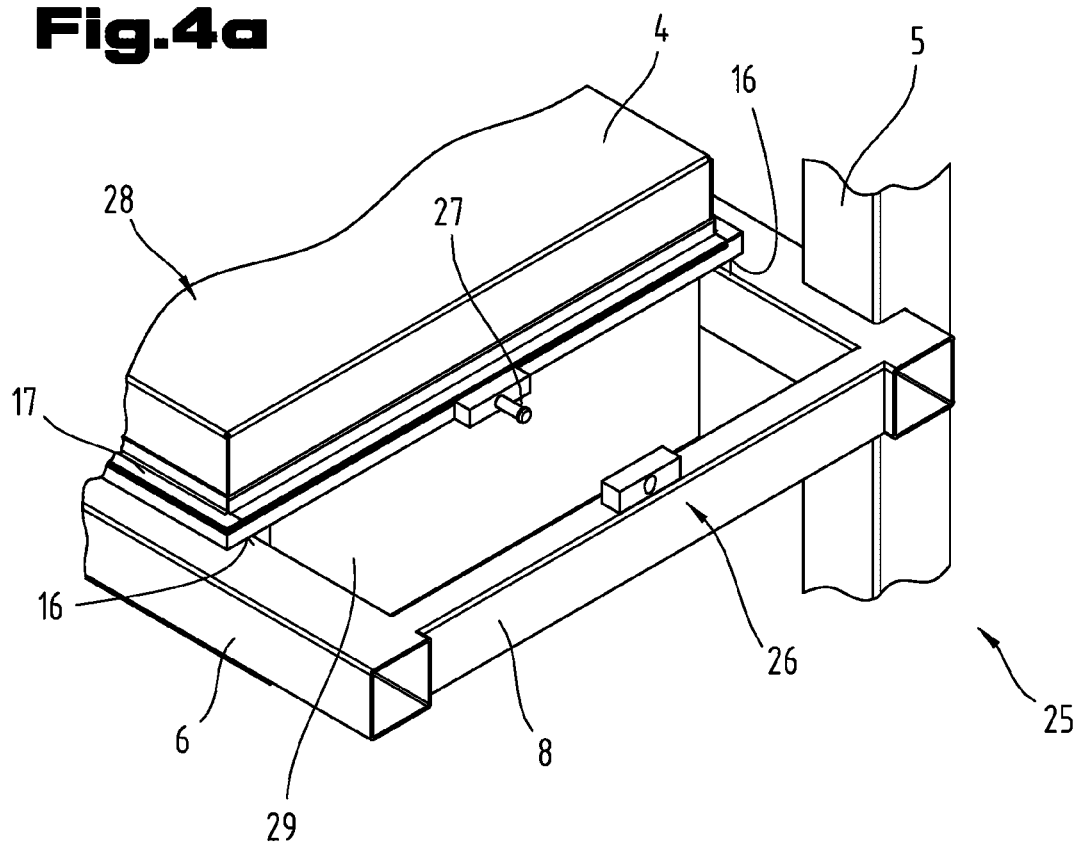
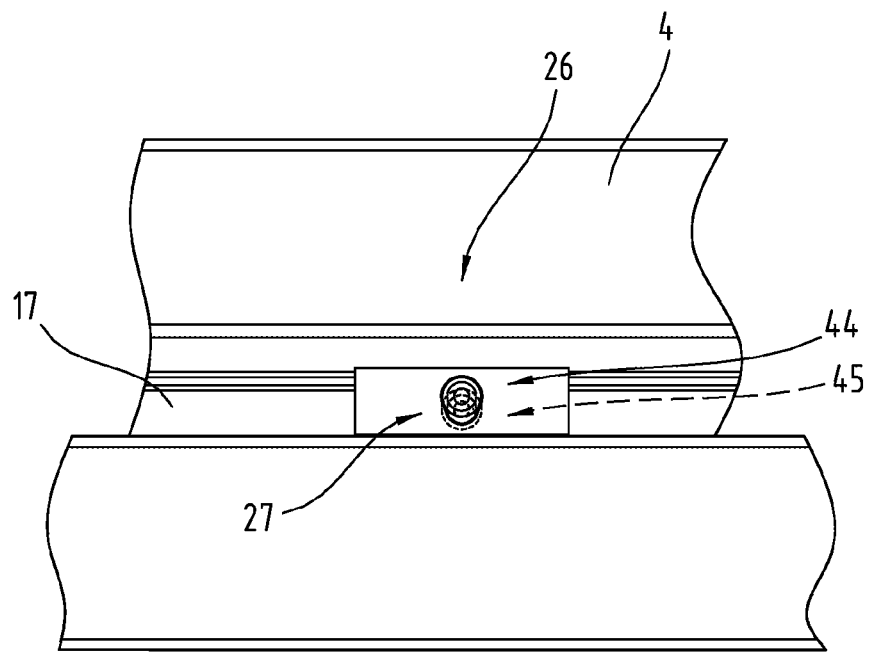

POWER ASSEMBLY HAVING A LOAD-BEARING COOLING BODY

RELATED APPLICATIONS

This application is a national stage under 35 U.S.C. § 371 of International Application No. PCT/AT2019/060172, filed May 23, 2019, which claims priority of Austrian Patent Application No. A50430/2018, filed May 25, 2018.

OVERVIEW

The present disclosure relates to a power module for a medium or high voltage converter, preferably a modular multilevel converter, which comprises a central cooling plate designed as a load-bearing element to accommodate at least energy storage and power semiconductor modules.

Modern medium or high voltage converters usually comprise a plurality of interconnected power modules for converting an alternating voltage into a direct voltage or vice versa. Such power modules can also be referred to as sub-modules, in particular in modular multilevel converters. In this regard, the person skilled in the art knows a plurality of possible arrangements of energy storage modules, power semiconductor modules, associated control devices and in particular cooling devices provided for cooling these elements.

WO2008/074274A1 discloses a multilevel converter having converter modules which have a plurality of power semiconductors and a plurality of energy storages, wherein at least one converter is mounted on an energy storage such that it is load bearing. For the formation of the modular multilevel converter, such multilevel converters are arranged such in a rack that the energy storage is supported on cross struts of the rack on its front and rear side, whereby the accessibility for a quick exchange of a power module is complicated. In such arrangements, relatively long connecting elements and/or connecting lines are required for contacting the connections for power means, control means and/or coolants, these having a negative impact on accessibility for the user.

US2017194878A1 discloses a possible structure for a power module and/or a sub-module of a multilevel converter, which provides that a power semiconductor module of the power module is at least partly arranged directly on a cooling plate. For mounting such a power module in a multilevel converter, however, a relatively complex frame construction for holding the individual components of the power module is required so as allow for load transfer onto a rack of a multilevel converter. Moreover, the disclosed construction has the disadvantage that the energy storage unit is arranged on the semiconductor unit in the vertical direction, which reduces the cooling effect of the cooling plate onto the energy storage unit.

EP1125355B1 discloses a converter capacitor module formed as the load-bearing component. The capacitors are mounted above power semiconductors which results in the disadvantage of a reduced heat dissipation of the cooling body arranged at a distance from the capacitors.

US 2016/128240 A1 discloses a cooling flow channel module for a power conversion device in which a structure of a cooling flow channel is provided for cooling a power conversion device including an inverter or LDC. US 2009/091897 A1 discloses an electrical power conversion device and universal enclosures of these devices for various applications. CN 106 452 105 A shows a device consisting of a cabinet body, a main control module located in the cabinet body and several high-frequency rectification devices connected in parallel. US 2010/321896 A1 discloses an electric power component mounted on a chassis of an electric power device, including a semiconductor element forming an electronic circuit and a cooling unit cooling the semiconductor element and serving as a reinforcing material to increase the strength of the chassis. EP 2 701 477 A1 discloses a package for an electronic device which comprises a package wall comprising a dielectric material, a first conductive layer abutting an inner surface of the package wall, and a second conductive layer abutting an outer surface. The DE 298 13 254 U1 shows a multi-phase three-point converter with several vertically running phase components which are arranged spatially next to each other in a spatial construction.

US 2005/002162 A1 discloses a variety of conceivable configurations of modular power converters with a thermal carrier to dissipate heat from the circuits. According to an exemplary embodiment, modular units can be assembled and connected to electronic circuits via plug-in arrangements or via an interface with a backplane or similar mounting and connection structures. The thermal carrier can have a variety of fuses or pads. By means of the pads the thermal carrier can be fixed and/or secured within a housing.

The person skilled in the art knows further arrangements for power modules in which the energy storage module is arranged in the longitudinal direction between the semiconductor module and/or control module. Predominantly, in this regard, the largest length extent of a power module is formed in the vertical direction, whereby multiple power modules can be arranged next to or one above the other in a rack to form a modular converter; however, this results in a relatively high constructional height.

The increasing demands on safety, especially explosion protection and operator safety, go hand in hand with the requirement for cost-effective production of the power module. Moreover, quick and comfortable exchangeability of a power module in case of damage is desirable. Moreover, an individual adaptability of a power module to the respective local requirements of a medium or high voltage converter to stationary plants would be desirable or would be of practical advantage for the use at movable installation places, such as on a train or ship.

Embodiments disclosed herein overcome the disadvantages of the prior art and provide a power module representing a simple, cost-effective, secure and quickly exchangeable platform solution.

The power module for a medium or high voltage converter, preferably a modular multilevel converter, comprises at least one power semiconductor module, at least one energy storage module and at least one cooling device. In this regard, the cooling device is designed as a cooling plate, which can be flown through by a coolant, wherein the at least one power semiconductor module is arranged on an upper side of the cooling plate and the at least one energy storage module is arranged on a bottom side of the cooling plate and wherein the at least one power semiconductor module is connected with the cooling plate in a thermally conductive manner. For load-bearing support on a rack of the medium or high voltage converter, the cooling plate comprises support surfaces projecting in the transverse direction with respect to at least one energy storage width of the energy storage module. Such a power module is preferably arranged within a receiving space of the rack of the medium or high voltage converter provided for this purpose, wherein the rack can be extended as desired in the transverse direction.

The power semiconductor module preferably comprises an IGBT assembly, MOSFETs, transistors or the like. The energy storage module preferably comprises a capacitor module, which can comprise a plurality of capacitors, and/or other useful energy storages. The connection of the individual components by means of suitable conductor elements, such as a busbar or the like, is sufficiently known to the person skilled in the art and is thus not elucidated in further detail. A controller for controlling the power module can be arranged on the upper or bottom side of the cooling plate.

By the formation of the cooling body as a load-bearing construction element, a support function of the power module on the rack is effected at the same time and a receiving platform for all modules arranged on the cooling body is formed. The cooling plate thus serves as a kind of mounting plate to accommodate the energy modules, power semiconductor modules and potential other components. Such components can for example be arranged on the cooling plate in the form of an auxiliary module and can for example comprise a controller, power supplies, resistors and the like. Depending on the structure and type of the medium or high voltage converter, in this regard, it can be advantageous to arrange at least one power semiconductor module on one side, e.g. the upper side, of the cooling plate and to arrange the at least one energy storage module on the opposite side, e.g. on the bottom side, of the cooling plate. Further arrangements, each with components at least partially arranged on the upper side and bottom side of the cooling plate, are within the design freedom of the constructor and can also be realized on the cooling plate with the platform arrangement according to the present disclosure. In any case, it is very advantageous for the cooling plate to be arranged centrally such that the dissipated heat of at least the energy and power semiconductor modules can be efficiently conducted away.

Moreover, by the formation of the cooling device as a cooling plate flown through by coolant, a reduction of the dimensions of the power module as compared for example to air cooling systems of the same efficiency can be realized. In this regard, a cooling liquid is particularly preferred as coolant. Hence, in particular a "flat", preferably lying, arrangement of the power module is allowed for. This favors the design of a medium or high voltage converter with comparably small overall dimensions since multiple power modules can be arranged on top of one another in the receiving spaces provided for this purpose. In particular as compared to "standing" power modules in known construction, in which the energy and power semiconductor modules significantly project beyond the receiving space in the longitudinal direction and beyond the width of the power module in the transverse direction, hence, a reduction of space requirement can be achieved.

A further advantage of the present solution is the good accessibility of the power module from the front side, since the cooling plate rests laterally on the support surfaces on carrier elements provided for this purpose, and a front-side cross struts can thus be avoided. Hence, the operator is enabled to carry out a quick and easily accessible exchange of the power module in case of damage and possible front-side connections of the power module are very easily accessible.

Moreover, it is useful that the at least one power semiconductor module is arranged on the upper side and the at least one energy storage module is arranged on the bottom side of the cooling plate.

Power modules usually have a very weight of more than 200 kg. In this regard, the energy storage module accounts for the majority of the overall weight. By this advantageous arrangement of the energy storage module on the bottom side, a very low center of gravity is achieved in the power module. Compared to known arrangements, this prevents an undesired tilting moment and thus increases user safety. Moreover, by the central arrangement of the energy storage module on the bottom side of the cooling plate, an essentially mechanically stress-free electrical connection of the energy storage module to the power semiconductor module can be formed by the cooling plate. In this regard, a controlled, admissible expansion of the energy storage module in the vertical direction towards the bottom as well as in the transverse direction laterally in case of alternating thermal stresses is allowed for. This phenomenon is known as "breathing" of a capacitor. Hence, the functionality of the power semiconductor module is ensured for a longer period of time since an undesired relative movement of possible contacts between the energy storage module to the power semiconductor module can be prevented.

It can further be provided that the cooling plate is designed such that a cooling plate length in the longitudinal direction to the cooling plate width in the transverse direction has a ratio of 5:1 to 1:2, in particular of 2:1 to 1:1, and is in each case larger than a power module height in the vertical direction.

The formation of the cooling plate in the indicated dimensions allows for a "flat" formation of the power module. Due to the smaller power module height in the vertical direction, tilting of the power module during an exchange operation can be prevented since the center of gravity of the power module is located relatively low. By the cooling plate preferably designed to project beyond a transverse direction in the longitudinal direction, moreover, a particularly good load distribution onto the rack of the medium or high voltage converter is ensured. A further advantage is that a very compact construction of the respective power modules results in low overall dimensions of the medium or high voltage converter.

Moreover, it can be provided that the cooling plate in the longitudinal direction on a rear side is formed to project at least beyond a part of the cooling plate width in relation to an energy storage length.

According to this embodiment variant, the cooling plate which serves as a mounting platform can be used for improved support and additional support on a rear transverse element of the rack. This simple and cost-effective measure further offers the advantage that for different embodiments of a power module, different energy storage module sizes, e.g. by different numbers of capacitors, can be realized by means of a standardized cooling plate.

A design according to which it can be provided that at least one retaining element corresponding to a coupling device of the rack, preferably in the form of a pin with a groove or of a pin with a head that is wider than the pin diameter, is arranged on the rear side of the cooling plate, is also advantageous.

Such a coupling device is preferably arranged on or within a cross element of the rack and can for example be designed as a receiving body or as a lug. In this regard, the coupling element can comprise a receiving opening such as a longitudinal groove, which is designed so as to be complementary in shape to the corresponding retaining element of the cooling plate. In case of a change of the power module, the power module is brought into a service position, wherein the support surfaces of the cooling plate are lifted in the vertical direction above the support elements of the rack. In this service position, the power module can be inserted into the receiving grooves provided for this purpose in the rack, wherein the retaining element can for example serve as a centering aid and simultaneous forms an end stop in the longitudinal direction towards the rack. When the power module is lowered from the service position into the rest position, the pin-shaped retaining element by means of a groove and/or a head engages with the corresponding receiving opening of the coupling device, whereby locking of the power module on the rack is ensured. A pin with a groove or a pin with a head that is wider than the pin diameter has proven particularly advantageous. Such a coupling device hence prevents the requirement of separate securing of the power module against falling out of the rack and is cost-effective and designed to be extremely safe due to the automatic locking mechanism.

According to a further embodiment, it is possible that the cooling plate comprises at least one connection opening in the vertical direction for leading through and contacting electrical connections of the energy storage module to the power semiconductor module and/or controller.

The connection of the energy storage module can be connected, for example, as terminals on a connection block centrally in the transverse and/or longitudinal direction of the cooling plate. This allows for all current-carrying lines can be arranged to extend within the power module. Moreover, the central arrangement of such a connection block and/or connection terminal and leading through a connection opening in the cooling plate in the middle offers the possibility to effectively reduce parasitic inductances of the energy storage.

Further, the power module comprises at least one upper-side housing for receiving the power semiconductor module and/or the controller and at least one bottom-side housing for receiving the energy storage module, formed such that they can be mounted on, preferably be coupled to, the cooling plate.

The upper-side and/or bottom-side housing can be understood as a covering of the power module. As regards a suitable explosion protection for adjacently arranged power modules, in this regard, it is advantageous if an upper-side and/or bottom-side housing comprises no openings other than potentially required connection opening for electrical connections and/or control connections. However, in case of service it is advantageous if an upper-side and/or bottom-side housing can be removed and/or reattached as easily and quickly as possible. In the simplest case this is realized by a plurality of screw connections.

Moreover, it can be provided that the torsional stiffness of the cooling plate about a horizontal torsional axis is higher than the torsional stiffness of the upper-side housing and/or the bottom-side housing.

During production of an upper-side and/or bottom-side housing, warping, e.g. welding distortion, of the housing can occur. Such housings can have a very high transverse stiffness and/or bending stiffness, which could cause distortion of the cooling plate if the upper-side and/or bottom-side housing is attached to the cooling plate. To allow for optimum support of the power module on the rack, it is advantageous to design the cooling plate such that its torsional stiffness exceeds that of the upper-side and/or bottom-side housing. It is up to the person skilled in the art to carry out constructive, stiffness-improving measures, which, in addition to optimizing the cooling plate thickness, may also include the provision of any necessary stiffening elements on the cooling plate or similar suitable measures. This prevents a transmission of a possible distortion to the cooling plate that may occur due to welding of the housing.

Moreover, it can be provided that at least the bottom-side housing, for increasing the torsional stiffness of the power module, comprises a cover element resting flat on the cooling plate, wherein the bottom-side housing is connected to the cooling plate at a plurality of attachment points.

In addition to the embodiments of the bottom-side housing mentioned above, it can be advantageous for the bottom-side housing to be formed essentially as a close box except for a connection opening. In particular where the bottom-side housing is used for receiving the energy storage width, a stable formation of the bottom-side housing is advantageous. The inherent stiffness of the bottom-side housing can be advantageously used to increase the stiffness, especially the torsional stiffness, of the cooling plate. For this purpose, it is necessary that the cover element of the bottom-side housing is in contact with the underside of the cooling plate over as large an area as possible. Hence, the cover elements performs the same function towards the inside of the bottom-side housing through direct contact with the cooling plate. The cover element can thus be understood as a part of the cooling plate. To ensure a suitable connection of the cover element with the cooling plate, it is advantageous to carry out multiple screw connections at attachment points. By such a gapless screwing of the cover element, a good heat transfer to the cooling plate is ensured. Likewise, for improving the heat transfer, an intermediate medium, such as a "gap pad" and/or a thermal grease, can be provided between the cooling plate and the cover element functioning as a part of the cooling plate.

According to a particular embodiment, it is possible that the bottom-side housing, in particular the cover element, on the side of the cooling plate in the transverse direction relative to the energy storage width comprises protruding projections, in particular protruding up to the cooling plate width.

In certain cases, it has proven to be advantageous to attach the bottom-side housing to the cooling plate via protruding projections on the sides of the bottom-side housing. These projections, besides the attachment property, can have the advantage that they serve as an intermediate element for support of the power module and/or the cooling plate on the rack. Hence, a part of the load transfer from the cover element to the bottom-side housing can be carried out. Besides an increase in the stiffness of the power module, an additional effect can be used which is effected by a changed material pairing at the contact surface of the power module to the rack. In the case of an aluminum cooling body, the susceptibility to corrosion in relation to a steel carrier element can be reduced by the fact that the bottom-side housing or the projections used to rest on the carrier element of the rack are also made of steel.

According to an advantageous embodiment, it can be provided that an intermediate element, preferably made of a material different from the material of the cooling plate and/or the bottom-side housing, is provided on the supporting surface of the cooling plate and/or the bottom-side housing opposite the rack of the medium or high voltage converter.

By this measure, undesired corrosion phenomena between the cooling plate and the rack can be prevented. A further advantage is that a thus formed intermediate element can serve to absorb and dampen vibrations of the rack. For this purpose, electrically non-conductive materials with suitable vibration damping properties are particularly suitable. In practice, in particular strip-shaped intermediate elements made of a synthetic plastic material or GFRP have proven to be useful.

In particular, it can be advantageous if, in each case, a least two electrical connections and/or control connections and/or possible measuring and/or auxiliary connections and/or coolant connections preferably designed as quick-release connectors are formed on a front side of the power module.

By this measure, a very good accessibility of all connections of the power module is ensured. A simple, fast and safe connection and/or disconnection of the connections can thus be achieved. Moreover, this measure promotes explosion protection since all connection openings of the power module are arranged merely on the front side.

In addition to this, it can be provided that the at least two coolant connections, which are preferably designed as quick-release connectors, for coupling to a coolant circuit of the medium or high voltage converter are arranged on the front side of the cooling plate in a freely accessible manner.

The formation of the power module according to embodiments disclosed herein allows for arrangement of the coolant connections on the front side of the cooling plate, which makes them easy to access for an operator. Preferably, the coolant connections are designed as quick-release connectors, whereby automatic sealing is performed when the coolant connection is disconnected. Hence, unintended leakage of coolant can be prevented. Moreover, such quick-release connectors are easy to operate.

An embodiment according to which it can be provided that the coolant connections are designed such that, in each case, at least one connecting section is formed to point downwards in the vertical direction, is also advantageous.

By means of such a formation of the coolant connections, it is allowed for that automatic coupling of the coolant connections with the corresponding counterparts of a coolant circuit of the medium or high voltage converter can be carried out during lowering in the vertical direction. This type of automatic coupling is quick and easy as well as particularly secure and prevents faulty operation by an operator. In this regard, a design can be selected which allows for automatic decoupling when the power module is lifted, whereby the security and speed in the changing operation can be significantly increased.

Moreover, it can be provided that at least one stop element projecting beyond the cooling plate width is arranged on the end face of the cooling plate in the transverse direction. Such a stop element can be rigidly connected to the cooling plate and thus serves as a depth stop in the longitudinal direction of the power module when inserting it into a receiving space of the rack of the medium or high voltage converter. A pair-wise arrangement on both sides of such stop elements is preferred. Hence, a secure, quick and easy possibility for a correct positioning of the power module in the rack can be ensured. A further advantage is that all power modules are aligned in one plane in the vertical direction, whereby all connections, and in particular the electrical connections, are aligned in one plane. Hence, when the power modules are interconnected with one another, a mechanical bracing of the connection strips between the electrical connections is avoided.

According to a further embodiment, it is possible that the cooling plate is assembled of at least two cooling plate segments divided in the longitudinal direction and/or the transverse direction and/or the vertical direction, for the formation of a continuous coolant channel.

The formation of the cooling plate by assembling multiple cooling plate segments allows for easy modular construction of the cooling plate, whereby, according to the platform idea, a simple demand-oriented adaptation to the arrangement of the power semiconductor module and/or the energy storage module can be carried out on the cooling plate. In the simplest case, a cooling plate can be formed by connecting two horizontally divided cooling plate segments, wherein at least one cooling plate segment comprises a recess for a coolant channel. The cooling plate segments can be connected to one another by means of suitable connecting elements. Soldered connections are also conceivable in this context. To increase the solidity, the cooling plate segments can be connected by means of a welding connection. In particular in cooling plates made of aluminum or aluminum alloys, a connection of the cooling plate segments to one another by means of friction stir welding has proven advantageous.

Moreover, it can be useful if at least two cooling plate segments have different cooling capacities.

Hence, it becomes possible to optimize the local heat dissipation through the cooling plate. The measures described above thus allow a local adaptation of the heat dissipation capacity according to the predeterminable arrangement of in particular power semiconductors and/or energy storages on the cooling plate. Moreover, such a formation of the cooling plate may result in a cost-effective design.

In addition to this, it can be provided that at least one cooling plate segment, for the formation of a continuous coolant channel in the assembled state of the cooling plate, comprises a coolant channel recess for receiving a coolant line complementary in shape, which is enclosed by the cooling plate in the assembled state of the cooling plate.

In certain cases, it can be advantageous if a separate coolant line is provided, which is arranged within the cooling plate. For receiving such a coolant line, at least one cooling plate segment can be pre-machined, for example by milling out a cooling channel recess, in an easy manner on at least one side. This measure can be particularly advantageous where multiple cooling plate segments are connected to one another, since the commonly formed coolant channel is protected against coolant loss in any case by the internal coolant line. For improved heat transmission, the coolant line can for example be formed from copper or, for preventing corrosion phenomena as compared to a cooling plate made of aluminum, for example be formed from a corrosion-resistant steel. To improve the heat transmission of the coolant line, it is advantageous to connect to the cooling plate it be means of a solder connection. Likewise, the formation of a coolant line can be advantageous where a coolant, in particular a cooling liquid, is used which could lead to corrosion problems with the material of the cooling plate. An example is a combination of deionized water with aluminum, which can lead to the avoidance of the above-mentioned problems by using a corrosion-resistant steel as the coolant line.

BRIEF DESCRIPTION OF THE DRAWINGS

For the purpose of better understanding of the invention, it will be elucidated in more detail by means of the figures below.

These show in a respectively very simplified schematic representation:

FIG. 4 schematic oblique view of the rear side of the rack with the power module and the coupling device (a), as well as of the principle of centering and/or locking (b);

DETAILED DESCRIPTION OF PREFERRED EMBODIMENTS

First of all, it is to be noted that in the different embodiments described, equal parts are provided with equal reference numbers and/or equal component designations, where the disclosures contained in the entire description may be analogously transferred to equal parts with equal reference numbers and/or equal component designations. Moreover, the specifications of location, such as at the top, at the bottom, at the side, chosen in the description refer to the directly described and depicted figure and in case of a change of position, these specifications of location are to be analogously transferred to the new position.

Figure 1:
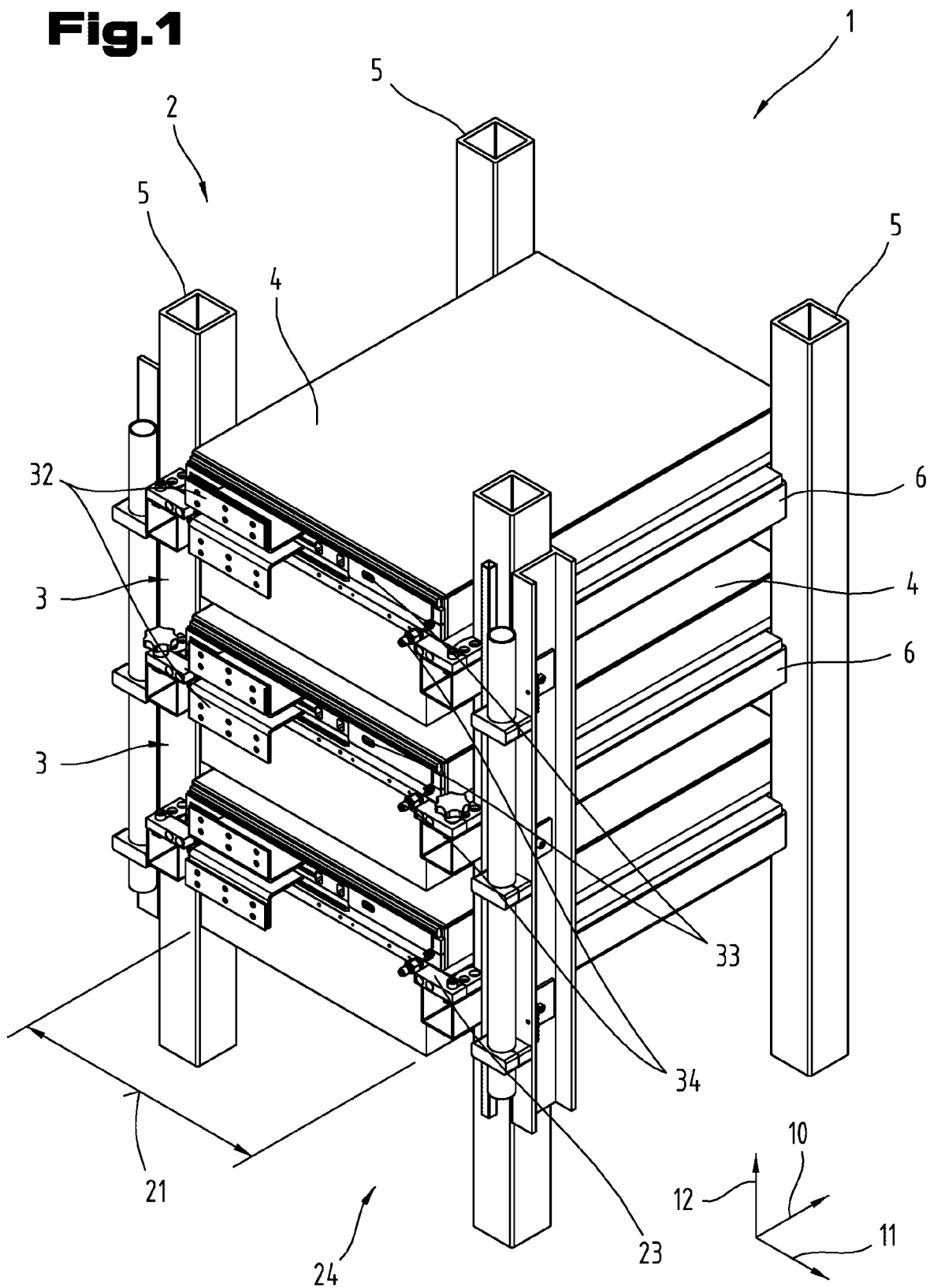
FIG. 1 schematic oblique view of a part of a medium or high voltage converter with three power modules arranged on top of one another.

FIG. 1 shows an example of a medium or high voltage converter 1. Such a medium or high voltage converter 1 has a rack 2 in which multiple receiving spaces 3 arranged on top of one another for each receiving one of the power modules 4 are formed. A medium or high voltage converter 1 can comprise multiple such racks 2 and thus a plurality of power modules 4. In this regard, the rack 2 comprises vertical standing elements 5, which are in each case arranged pair-wise and are connected to one another by means of horizontally aligned carrier elements 6. The carrier element 6 can be connected on the rear side 25 of the rack 2 by means of transverse elements 8. By the connection of carrier elements 6 and a transverse element 8, a rack is formed, wherein the power module 4 is supported in a load-bearing manner at least on the carrier elements 6.

It can further be seen from FIG. 1 that each power module 4 can comprise a plurality of connections, such as electrical connections 32, control connections 33 as well as coolant connections 34. These connections are advantageously oriented aligned towards one another in vertical direction 12. By the arrangement of the connections on the front side 24, a very good accessibility for an operator is possible. The shown exemplary embodiments of the power modules 4 are shown in the rest position 44, wherein each power module 4 is supported on the rack 2 at the carrier elements 6 by means of support surfaces 16 projecting in relation to the energy storage width 21 of the energy storage module 9. For changing a power module 4, it is required to lift the power module 4 into a service position 45 in the vertical direction 12 and to move it out of the rack 2 in the longitudinal direction 10. In the selected representation, it can further be seen that the power modules 4 have their largest longitudinal extent in the longitudinal direction 10, which in the present example significantly exceeds the longitudinal extent in the transverse direction 11 as well as in the vertical direction 12. Hence, an essentially lying arrangement of the power module 4 on the carrier element 6 is ensured. An alternative dimensioning with a larger longitudinal extent in the transverse direction 11 is also conceivable, as long as the "flat" lying arrangement is maintained. In certain cases, it can be advantageous if the cooling plate 17 exceeds the energy storage length 22 in the longitudinal direction 10. This can for example be used for the cooling plate 17 offering an additional support surface for support on a transverse element 8 in the direction of the rear side 25.

Figure 2:
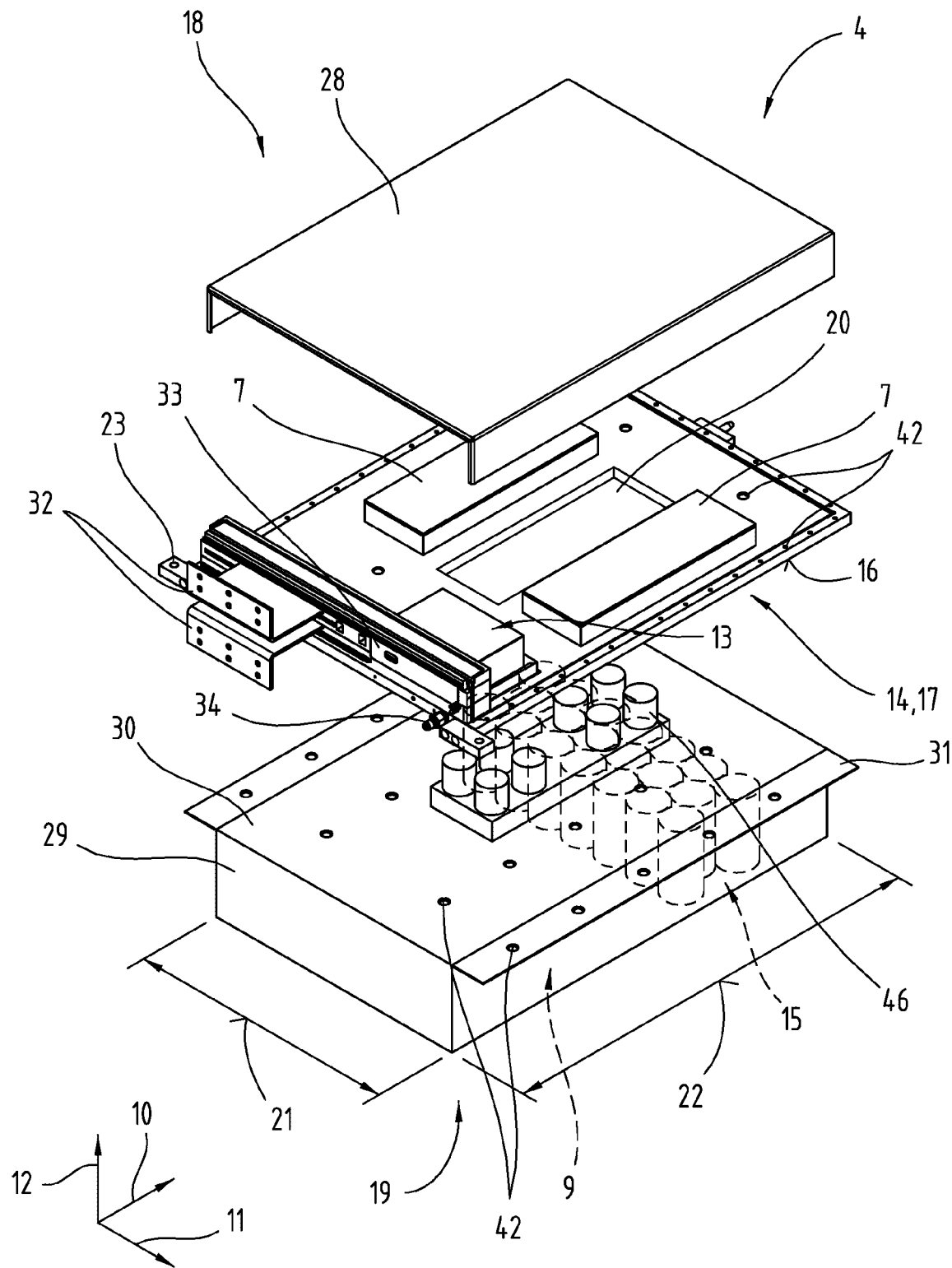
FIG. 2 schematic oblique view of an exemplary embodiment of a power module having a load-bearing cooling plate.

The cooling plate 17 preferably serves on the one hand for load-bearing support on the rack 2 and on the other hand for heat dissipation at least of one power semiconductor module 7 as well as at least one energy storage module 9, which can be arranged on an upper side 18 and/or bottom side 19 of the cooling plate 17. An exemplary embodiment of an arrangement of the power semiconductor module 7 on the upper side 18 of the cooling plate 17 is schematically shown in FIG. 2. Preferably, the at least one energy storage module 9 is arranged on the bottom side 19 of the cooling plate 17. In this regard, the energy storage module 9 can for example have a plurality of capacitors 15, whereby a high inherent weight of the energy storage module 9 must be carried by the cooling plate 17. The preferred embodiment shown in FIG. 2 in the exploded view offers the significant advantage of a lower center of mass of the power module 4 as compared to the bearing and/or support surfaces 16. Hence, an undesired tilting moment in the transverse direction 11 or in the longitudinal direction 10 can be prevented when changing the power module 4.

Moreover, it can be gathered from FIG. 2 that the at least one power semiconductor module 7 is connected to the cooling plate 17 in a thermally conductive manner. The shown essentially lying arrangement of the power semiconductor module 7 on the cooling plate 17 offers the further advantage of distribution of the power semiconductors across a relatively large support surface on the upper side 18 of the cooling plate 17. Hence, combined with the direct thermal connection to the cooling plate 17, a highly efficient heat dissipation of the power semiconductor module 7 can be ensured. The schematically depicted controller 13 can also be arranged at a suitable position on the cooling plate 17. In general, a reversed arrangement of the power semiconductor module 7 on the bottom side 19 and of the energy storage module 9 on the upper side 18 is also conceivable. Depending on the complexity, a power module 4 can also have both components formed on the respective side.

Since the cooling device 14 is formed as a cooling plate 17 that can be run through by a coolant, in particular flown through by a cooling liquid, the cooling plate 17 can be used as a base structure and/or carrier platform for the individual components of the power module 4. This platform idea can be used to equip medium or high voltage converters 1 with power modules 4 optimized for the respective use.

Moreover, it can be seen from FIG. 2 that an upper-side housing 28 and/or a bottom-side housing 29 can be provided. These housings are not obligatorily closed in all three spatial directions; however, it can be advantageous if, in particular in the transverse direction 11 and in the longitudinal direction 10, the side surfaces are closed for explosion protection. It has proven to be advantageous that the upper-side housing 28 or the bottom-side housing 29, which is provided for receiving the energy storage module 9, has a cover and/or bottom element 30. In the exemplary embodiment of FIG. 2, such a cover element 30 is shown as the end of the bottom-side housing 29 in vertical direction 12. The capacitors 15 that are held by the bottom-side housing 29 and form the energy storage module 9 can be connected to the power semiconductor module 7 via electrical busbars. The electrical conductors of the energy storage module 9 can, for example, be combined by means of a schematically depicted connection terminal 46. The central arrangement of such a connection terminal 46 and the symmetrical formation of the busbars, which are not depicted, can serve for preventing parasitic inductances. To allow for contacting the connection terminal 46 with the power semiconductor module 7, the cooling plate 17 is perforated by at least one connection opening 20 in the vertical direction 12. The position of the controller 13 can be accordingly optimized by the person skilled in the art, and is selected to be on the front end of the upper side 18 of the cooling plate 17 in the exemplary representation.

The cooling plate 17 must have a required minimum stiffness due to the load-bearing support function, in order to prevent a deflection of the cooling plate 17. Besides the bending stiffness in the vertical direction 12, in this regard, the torsional stiffness about an imaginary spatial axis can be of relevance. Twisting of the power module 4, in particular of the cooling plate 17, should be avoided when assembling the power module 4 to ensure a permanent flat contact of the power semiconductor module 7 to the cooling plate 17. The cooling plate 17 can thus have additional reinforcing elements on the upper side 18 and/or bottom side 19. An alternative to this is using the inherent stiffness, in particular the torsional stiffness, of the upper-side housing 28 and/or of the bottom-side housing 29 to increase the overall stiffness, in particular the torsional stiffness, of the power module 4. The upper-side housing 28 and/or the bottom-side housing 29 can thus be mounted on the cooling plate 17. Such mounting can be realized both by welding and preferably by means of a plurality of screws at attachment points 42 provided for this purpose.

In a preferred embodiment, the torsional stiffness of the bottom-side housing 29 can be used to increase the torsional stiffness of the power module 4. In this case, which is shown in FIG. 2, the bottom-side housing 29 has a cover element 30 resting flat on the cooling plate 17. The cover element 30 is connected to the cooling plate 17 at a plurality of attachment points. Preferably, the cover element 30 is connected to the cooling plate 17 in the vertical direction 12 through it. These attachment points 42 can thus be distributed across the cooling plate 17 in the longitudinal direction 10 and the transverse direction 11, whereby a connection over a large area of the cooling plate with the cover element 30 is ensured and a formation of gaps can be prevented. By these measure, a sufficiently well heat transmission of the cooling plate 17 across the cover element 30 in the direction of the energy storage module 9 can be ensured. In such a case, the cover element 30 is understood as a part of the cooling plate 17.

In certain cases, it can be advantageous if the bottom-side housing 29 and in particular the cover element 30 have projections 31 in the transverse direction 11. These projections 31 can on the one hand be used to form an additional possibility for attachment points 42. On the other hand, such projections 31 protruding in the transverse direction 11 with respect to the energy storage width 21 can serve as a type of intermediate element for supporting the power module 4 with respect to the rack 2. Moreover, a bottom-side housing 29 mounted on the cooling plate 17 in this manner can significantly increase the torsional stiffness and/or bending stiffness of the power module 4 i.e. of the cooling plate 17.

In a case which is not shown, the projections 31 can protrude so far in relation to the energy storage width 21 that they serve for support of the cooling plate 17 on the rack 2. Like, a not depicted intermediate element having the same function, i.e. the separation of the direct support of the support surface 16 of the cooling plate 17 by the rack 2 is conceivable.

FIGS. 3a and b show different embodiments of a cooling plate 17. In this regard, it can be seen from FIG. 3a that the cooling plate 17 can be assembled of multiple cooling plate segments 37. The dashed lines show a continuously formed coolant channel 43. As can particularly well be seen from FIG. 3a, different cooling plate segments 37 can have different cooling capacities. This is schematically indicated by the coolant channel 43 arranged in meandering shape having a different number of coolant channel windings in the different cooling plate segments 37. A cooling plate 17 can hence be easily adapted to locally required heat dissipation conditions by connecting multiple cooling plate segments 37. It is thus possible in a simple manner to assemble a one-piece cooling plate 17 from at least two cooling plate segments 37, which were produced separately in the longitudinal direction 10 and/or in the transverse direction 11 and/or in the vertical direction 12.

In a particular embodiment, it can be advantageous if a cooling plate segment 37 or an entire cooling plate 17 is separated in the longitudinal direction 10 and at least one of the cooling plate segments 37 has a coolant channel recess 38. See in particular FIG. 3b in this regard. Such a coolant channel recess 38 can for example be milled and offers room for a coolant line 39, which in the assembled state of the cooling plate 17 is entirely enclosed by the cooling plate 17.

Such a simple and modular structure of the cooling plate 17 offers particular advantages in view of the platform idea in combination with the load-bearing function of the cooling plate 17.

Figure 3B:
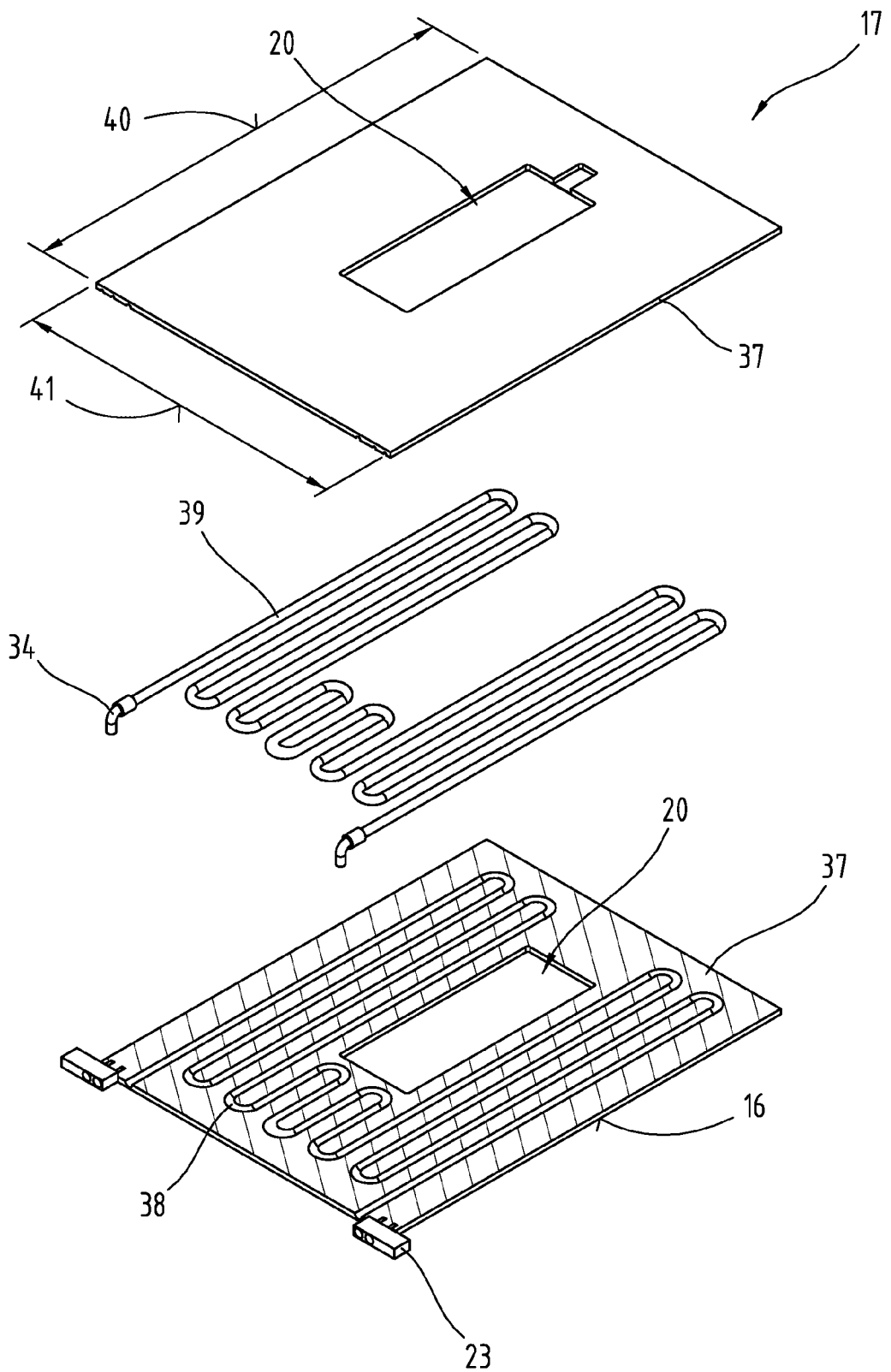
FIG. 3 exemplary representation of an exemplary embodiment of a cooling plate having multiple cooling plate segments (a), and of an exploded view of two cooling plate segments with coolant line (b)

Moreover, the formation of stop elements 23 on the cooling plate 17 can be seen from FIG. 3b in combination with FIGS. 1 and 2 as well as FIG. 5. Such stop elements 23 are formed to project beyond the cooling plate width 41 in the transverse direction 11. They can be for positioning the power module 4 within the rack 2 in an easy, quick and correct manner during introduction into the service position 45.

A further possibility of a depth stop in combination with a locking function is shown in FIG. 4 by way of example. FIG. 4a shows a schematic representation of a coupling device 26 on the rack 2. Such a coupling device 26 can for example be designed as a lug or as a block-like element, wherein preferably a longitudinal opening for receiving the corresponding retaining element 27 of the cooling plate 17 can be formed. In this respect, the retaining element 27 is preferably configured as a pin or bolt having a taper in the transverse direction 11, which, in the service position 45, meaning in a raised state of the power module 4, is connected to the coupling device 26 upon insertion into the rack. The pin or bolt preferably has a groove and/or a head that is widened with respect to the pin diameter, which head, upon lowering, is arrested from below by means of the coupling device 26 on at least one side in the vertical direction 12. The functioning is schematically shown by means of FIG. 4b. In this rear-side view, the rest position 44 is adumbrated in dashed lines. When the power module 4 is lowered from the service position 45 into the rest position 44, the retaining element 27 is locked in the coupling device 26. The free end of the taper pin or bolt of the retaining element 27 can be designed such, as compared to the receiving opening of the coupling device 26, by the tapering or a projecting elevation that it is fixed by the coupling element 26 when it is lowered. This measure prevents slipping of the power module 4 caused by external vibrations, as can for example occur in case of an earthquake. Moreover, the design of the coupling device 26 as well as of the retaining element 27 formed on the cooling plate 17 allow for a self-centering function of the power module 4 within the receiving space 3 of the rack 2.

Figure 5A:
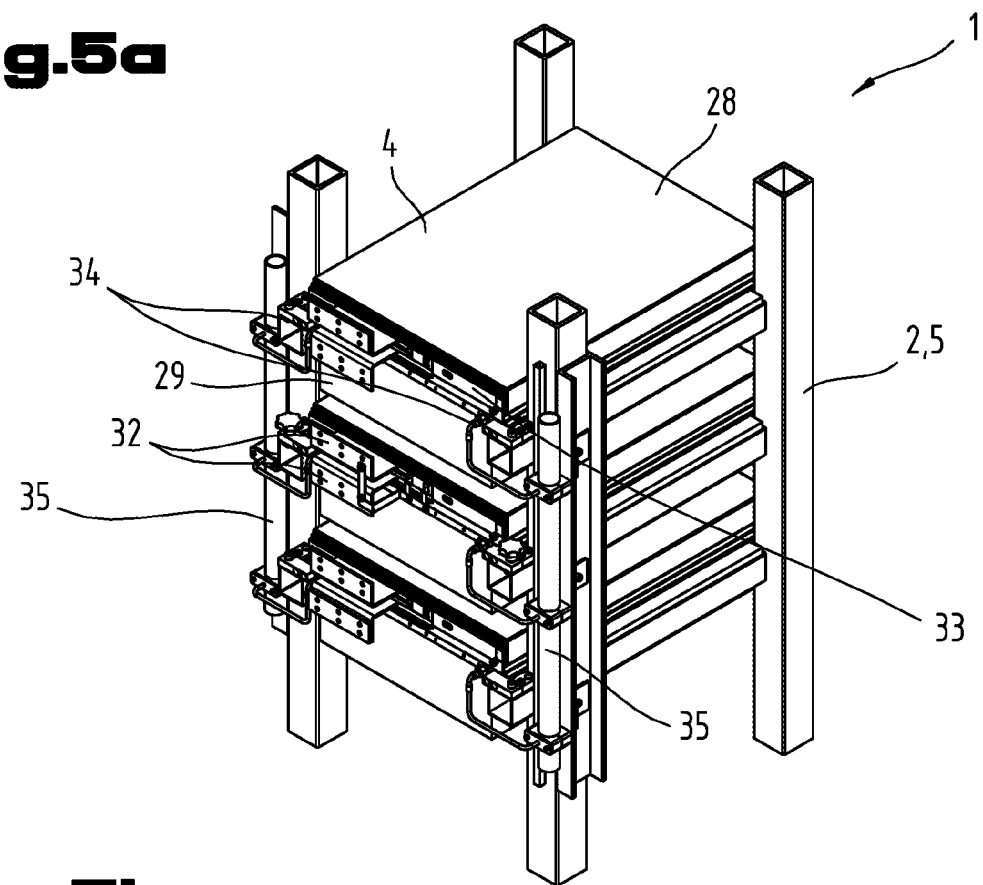
FIG. 5 schematic oblique view of a part of a medium or high voltage converter with coupled coolant circuit (a), and of an exemplary embodiment for automatic coupling (b).
Figure 5B:
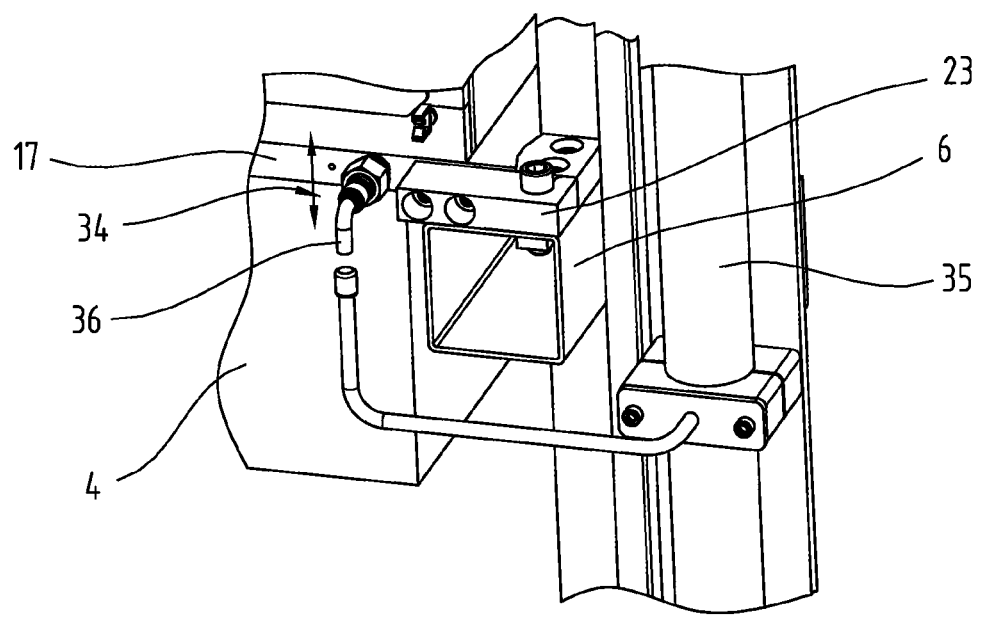

In FIG. 5, a further and possibly independent embodiment of the cooling plate 17 and/or the power module 4 is represented. A repetition of the description of equal parts is omitted making reference to FIGS. 1 to 4 described above. FIG. 5a shows an arrangement of multiple power modules 4 in a rack 2, wherein the power modules 4 are connected to a coolant circuit 35 of the medium or high voltage converter 1 by means of their coolant connections 34. Analogously to the exemplary embodiments described above, the coolant connections 34 are preferably designed as quick-release connectors. Hence, easy and quick coupling to the coolant circuit 35 can be carried out. FIG. 5b shows an enlarged schematic representation of a coolant connection. It can be gathered therefrom that the coolant connection 34 comprises a connecting section 36, which is designed to point downwards in the vertical direction 12. The corresponding supply and/or discharge line of the coolant circuit 35 is bent upwards analogously thereto. Hence, automatic coupling of the coolant circuit 35 with the coolant connection 34 can be carried out during lowering of the power module 4 from the elevated service position 45 into the rest position 44. It is easily conceivable that an automatic decoupling is carried out during lifting into the service position 45 by means of suitable quick couplings. Likewise, it can particularly well be seen in FIG. 5b that the stop element 23 for correct positioning of the power module 4 in the longitudinal direction 10 also ensures a correct positioning of the coolant connection 34 in relation to the coolant circuit 35.

The exemplary embodiments show possible embodiment variants, and it should be noted in this respect that the invention is not restricted to these particular illustrated embodiment variants of it, but that rather also various combinations of the individual embodiment variants are possible and that this possibility of variation owing to the teaching for technical action provided by the present invention lies within the ability of the person skilled in the art in this technical field.

The scope of protection is determined by the claims. However, the description and the drawings are to be adduced for construing the claims. Individual features or feature combinations from the different exemplary embodiments shown and described may represent independent inventive solutions. The object underlying the independent inventive solutions may be gathered from the description.

All indications regarding ranges of values in the present description are to be understood such that these also comprise random and all partial ranges from it, for example, the indication 1 to 10 is to be understood such that it comprises all partial ranges based on the lower limit 1 and the upper limit 10, i.e. all partial ranges start with a lower limit of 1 or larger and end with an upper limit of 10 or less, for example 1 through 1.7, or 3.2 through 8.1, or 5.5 through 10.

Finally, as a matter of form, it should be noted that for ease of understanding of the structure, elements are partially not depicted to scale and/or are enlarged and/or are reduced in size.

The invention claimed is:

1. A power module for a medium or high voltage converter, comprising:
   at least one power semiconductor module,
   at least one energy storage module,
   at least one cooling device formed as a cooling plate that can be run through by a coolant, in particular flown through by a cooling liquid, and
   wherein the at least one power semiconductor module is connected with the cooling plate in a thermally conductive manner, wherein
   the at least one power semiconductor module is arranged on an upper side of the cooling plate and the at least one energy storage module is arranged on a bottom side of the cooling plate, and wherein
   the power module further comprises at least one upper-side housing for receiving the power semiconductor module and/or a controller and at least one bottom-side housing for receiving the energy storage module, formed such that the upper-side housing and the bottom-side housing can be mounted on the cooling plate, and
   wherein the cooling plate is provided for load-bearing support on a rack of an assigned receiving space of the medium or high voltage converter, and the cooling plate includes support surfaces projecting laterally in the transverse direction with respect to at least one energy storage width of the energy storage module, and
   wherein the cooling plate comprises at least one connection opening in the vertical direction for leading through and contacting electrical connections of the energy storage module to the power semiconductor module and/or the controller.

2. The power module according to claim 1, wherein the cooling plate is designed such that a cooling plate length in the longitudinal direction to the cooling plate width in the transverse direction has a ratio of 5:1 to 1:1, and is in each case larger than a power module height in the vertical direction.

3. The power module according to claim 1, wherein the cooling plate in the longitudinal direction on a rear side is formed to project at least beyond a part of the cooling plate width in relation to an energy storage length.

4. The power module according to claim 1, wherein at least one retaining element, corresponding to a coupling device of the rack, is arranged on the rear side of the cooling plate.

5. The power module according to claim 1, wherein a torsional stiffness of the cooling plate about a horizontal torsional axis is higher than a torsional stiffness of the upper-side housing and/or the bottom-side housing.

6. The power module according to claim 1, wherein at least the bottom-side housing, for increasing a torsional stiffness of the power module, comprises a cover element resting flat on the cooling plate, wherein the bottom-side housing is connected to the cooling plate at a plurality of attachment points.

7. The power module according to claim 1, wherein the bottom-side housing on the side of the cooling plate in the transverse direction relative to the energy storage width comprises protruding projections.

8. The power module according to claim 1, wherein an intermediate element, made of a material different from the material of the cooling plate and/or the bottom-side housing, is provided on the supporting surface of the cooling plate and/or the bottom-side housing opposite the rack of the medium or high voltage converter.

9. The power module according to claim 1, wherein in each case at least two front side electrical connections and/or control connections and/or coolant connections and/or possible measuring connections and/or auxiliary connections are formed on a front side of the power module.

10. The power module according to claim 9, wherein the coolant connections are designed such that in each case at least one connecting section is formed to point downwards in the vertical direction.

11. The power module according to claim 1, wherein at least one stop element projecting beyond the cooling plate width is arranged on the end face of the cooling plate in the transverse direction.

12. The power module according to claim 1, wherein the cooling plate is assembled of at least two cooling plate segments divided in the longitudinal direction and/or the transverse direction and/or the vertical direction, for the formation of a continuous coolant channel.

13. The power module according to claim 12, wherein at least two cooling plate segments have different cooling capacities.

14. The power module according to claim 12, wherein at least one cooling plate segment, for the formation of a continuous coolant channel in the assembled state of the cooling plate, comprises a coolant channel recess for receiving a coolant line complementary in shape, which is enclosed by the cooling plate in the assembled state of the cooling plate.

15. The power module of claim 4, wherein the at least one retaining element includes a pin with a groove, or a pin with a head that is wider than the pin diameter.

16. The power module of claim 7, wherein the projections of the bottom-side housing protrude up to the cooling plate width.

17. The power module of claim 1, wherein the at least one power semiconductor module includes an IGBT assembly.

18. The power module of claim 1, wherein the at least one energy storage module includes a capacitor module.

* * * * *